United States Patent
Peng et al.

(10) Patent No.: US 9,615,479 B2
(45) Date of Patent: Apr. 4, 2017

(54) SLIDE RAIL INTERLOCKING APPARATUS AND ELECTRONIC DEVICE HAVING THE SAME

(71) Applicant: HON HAI PRECISION INDUSTRY CO., LTD., New Taipei (TW)

(72) Inventors: Wen-Tang Peng, New Taipei (TW); Ke-Cheng Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 50 days.

(21) Appl. No.: 14/543,597

(22) Filed: Nov. 17, 2014

(65) Prior Publication Data
US 2016/0105987 A1   Apr. 14, 2016

(30) Foreign Application Priority Data
Oct. 14, 2014   (CN) .......................... 2014 1 0540709

(51) Int. Cl.
| | |
|---|---|
| H05K 7/00 | (2006.01) |
| H05K 7/14 | (2006.01) |
| A47B 88/16 | (2006.01) |
| A47B 88/04 | (2006.01) |

(52) U.S. Cl.
CPC ......... *H05K 7/1489* (2013.01); *A47B 88/044* (2013.01); *A47B 88/16* (2013.01)

(58) Field of Classification Search
None
See application file for complete search history.

(56) References Cited

U.S. PATENT DOCUMENTS

| | | | | |
|---|---|---|---|---|
| 5,277,615 A * | 1/1994 | Hastings | ................. | G06F 1/181 361/679.32 |
| 5,340,340 A * | 8/1994 | Hastings | ................. | G06F 1/181 312/223.1 |
| 5,896,273 A * | 4/1999 | Varghese | ................. | G06F 1/181 312/223.2 |
| 6,351,379 B1 * | 2/2002 | Cheng | ................. | G11B 33/128 312/332.1 |
| 6,616,106 B1 * | 9/2003 | Dean | ....................... | G06F 1/184 248/27.1 |
| 6,962,397 B2 * | 11/2005 | Dobler | ............... | A47B 88/0407 312/333 |
| 7,144,092 B1 * | 12/2006 | Chang | ................. | E05B 65/462 312/217 |

(Continued)

*Primary Examiner* — Courtney Smith
*Assistant Examiner* — Rashen E Morrison
(74) *Attorney, Agent, or Firm* — Zhigang Ma (57) ABSTRACT

An electronic device includes a cabinet, a number of chasses received in the cabinet, a number of first slide rails mounted to the cabinet, a second slide rail mounted to each chasses fitting about the corresponding first slide rail, a rotating member connected to the cabinet, and a resilient member installed between the rotating member and the cabinet. The rotating member includes an abutting bar and a stopper bar opposite to the abutting bar. A front end of each second slide rail forms a first guiding surface. A block protrudes from the front end of each second slide rail. When one of the chasses is pulled out from the cabinet, the first guiding surface abuts against the abutting bar to rotate away from the chasses, the stopper bar is rotated to adjacent to the chasses to latch the blocks of the other chasses, and deforming the resilient member.

19 Claims, 11 Drawing Sheets

(56) References Cited

U.S. PATENT DOCUMENTS

| | | | | |
|---|---|---|---|---|
| 7,280,352 B2* | 10/2007 | Wilson | G06F 1/184 | 312/223.1 |
| 7,460,365 B2* | 12/2008 | Morris | G06F 1/187 | 361/679.33 |
| 8,118,267 B2* | 2/2012 | Yu | H05K 7/1489 | 248/222.11 |
| 8,243,433 B2* | 8/2012 | Yeh | G06F 1/187 | 361/679.02 |
| 8,385,076 B2* | 2/2013 | Peng | G11B 33/124 | 248/200 |
| 8,403,436 B2* | 3/2013 | Yu | H05K 7/1489 | 312/333 |
| 8,416,563 B2* | 4/2013 | Hou | H05K 7/1489 | 211/26 |
| 8,605,440 B2* | 12/2013 | Gong | H05K 7/1489 | 361/679.58 |
| 8,733,864 B2* | 5/2014 | Chen | A47B 88/10 | 312/333 |
| 9,420,716 B2* | 8/2016 | Ivey | H05K 7/1415 | |
| 2002/0085345 A1* | 7/2002 | Chen | G06F 1/184 | 361/679.33 |
| 2004/0075978 A1* | 4/2004 | Chen | G06F 1/187 | 361/679.33 |
| 2005/0116135 A1* | 6/2005 | Peng | G11B 33/124 | 248/694 |
| 2006/0164803 A1* | 7/2006 | Chen | G06F 1/184 | 361/679.37 |
| 2009/0310894 A1* | 12/2009 | Yu | H05K 7/1489 | 384/21 |
| 2011/0155449 A1* | 6/2011 | Tang | G06F 1/187 | 174/520 |
| 2012/0292274 A1* | 11/2012 | Lin | A47B 88/044 | 211/86.01 |
| 2013/0249359 A1* | 9/2013 | Tang | H05K 5/0239 | 312/223.2 |
| 2015/0062801 A1* | 3/2015 | Zhang | G06F 1/187 | 361/679.38 |
| 2015/0289405 A1* | 10/2015 | Stewart | H05K 7/183 | 211/26 |

* cited by examiner

SLIDE RAIL INTERLOCKING APPARATUS AND ELECTRONIC DEVICE HAVING THE SAME

FIELD

The subject matter herein generally relates to a slide rail interlocking apparatus, and more particularly to an electronic device with the slide rail interlocking apparatus.

BACKGROUND

Generally, a plurality of chasses are installed into a cabinet through slide rail structures such that the slide rail structures are arranged between the chasses and the cabinet for pushing and pulling the chasses to easily access the cabinet. However, after the chasses are placed in the cabinet, it will become extremely heavy. Although it is easy to push and fully pull these severs in and out, the position of the center of gravity of the cabinet will change after several chasses are pulled out at the same time.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to an electronic device.

Figure 1:
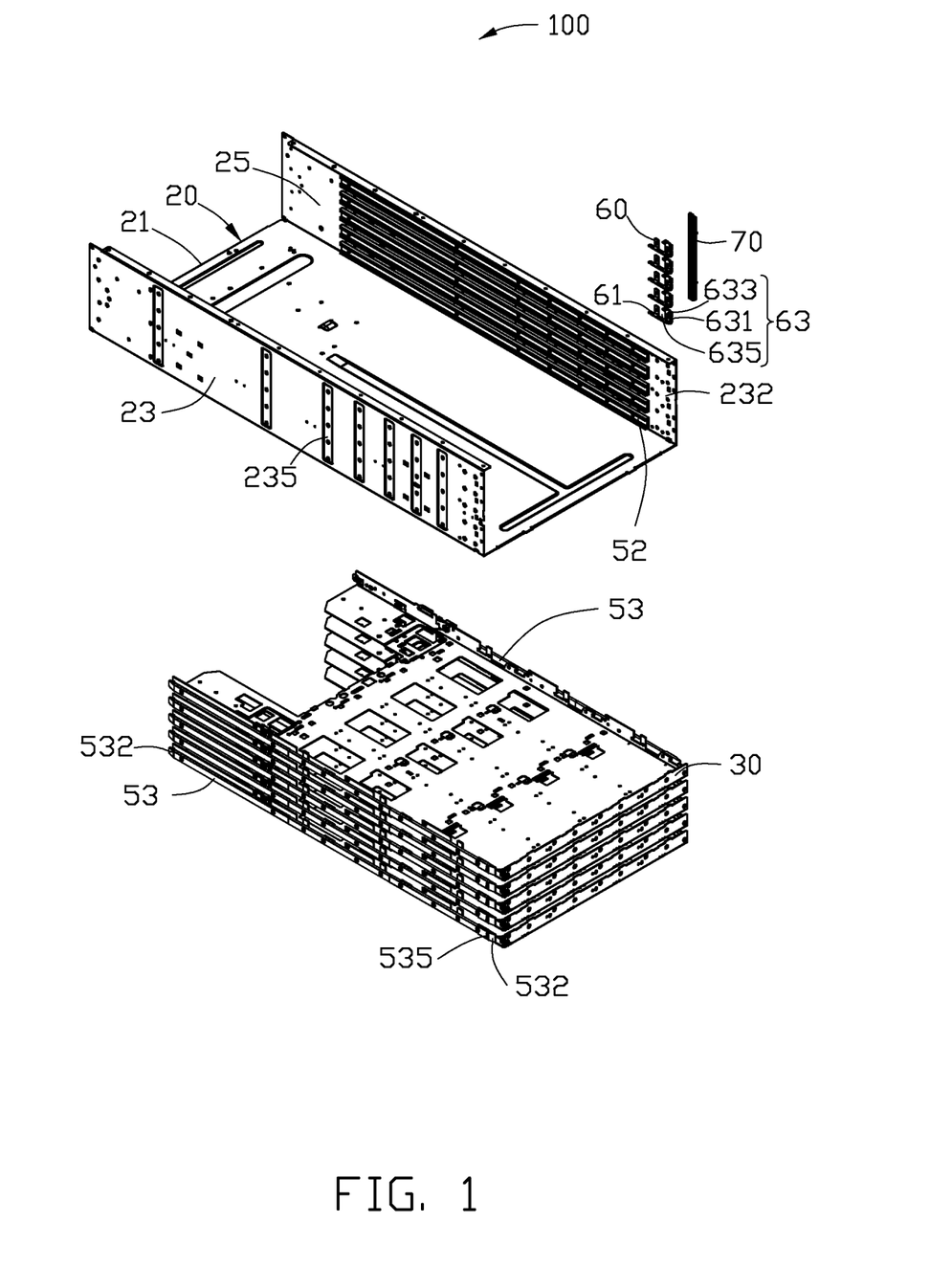
FIG. 1 is an exploded, isometric view of an embodiment of an electronic device, wherein the electronic device comprises a slide rail interlocking apparatus and a plurality of positioning members.

FIG. 1 illustrates an electronic device 100. The electronic device 100 comprises a cabinet 20, a plurality of chasses 30, a plurality of first slide rails 52, a plurality of second slide rails 53 fitting about corresponding first slide rails 52, a plurality of positioning members 60, and a slide rail interlocking apparatus 70. In the embodiment, each chasses 30 is a server chasses.

The cabinet 20 comprises a substantially rectangular bottom wall 21 and two opposite side walls 23 substantially perpendicularly extending up from two opposite sides of the bottom wall 21. The bottom wall 21 and the side walls 25 cooperatively bound a receiving space 25. A front portion of each side wall 23 defines a plurality of installing holes 232. A middle of each side wall 23 defines a plurality of latching holes 235.

The first slide rails 52 are mounted to inner surfaces of the side walls 23 through screws extending through the first slide rails 52 to latch in the corresponding latching holes 235. Each first slide rail 52 extends along a lengthwise direction of the side walls 23.

Two second slide rails 53 are mounted to two opposite sides of each chasses 30. Each second slide rail 53 extends along a longwise direction of the chasses 30. Two opposite ends of an outer surface of each second slide rail 53 slantingly form two guiding surfaces 532. A block 535 protrudes from a front end of each second slide rail 53 after the corresponding guiding surface 532.

Figure 2:
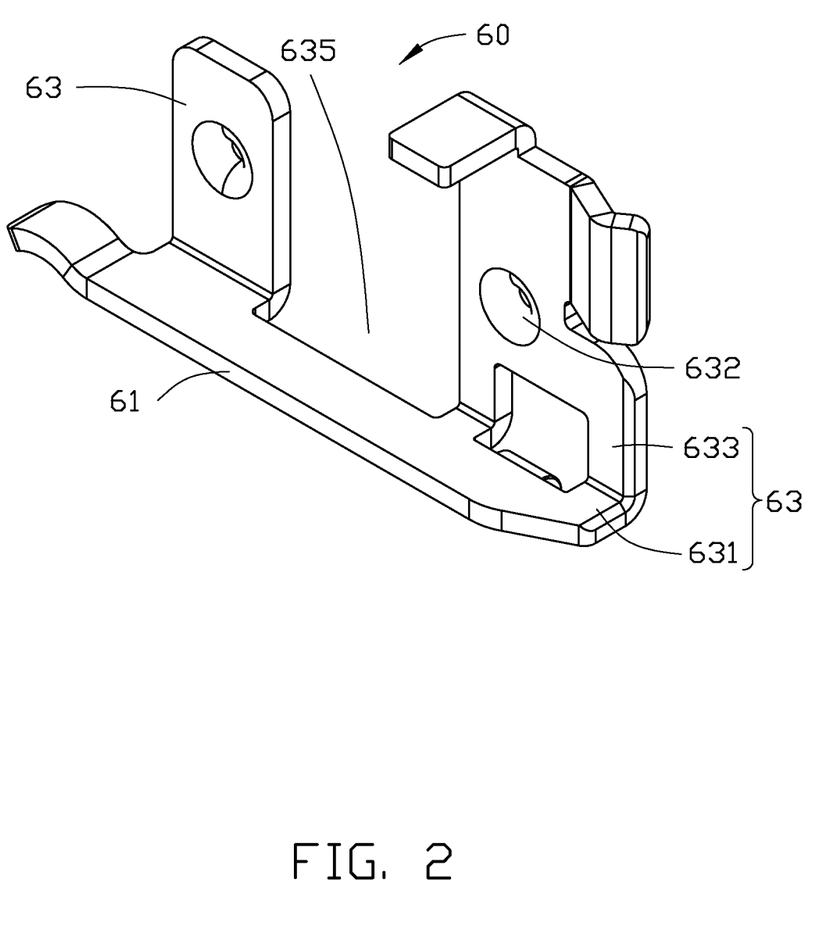
FIG. 2 is an enlarged, isometric view of one of the positioning members of FIG. 1.

FIG. 2 illustrates one of the positioning members 60. Each positioning member 60 comprises a substantially rectangular supporting piece 61 and two connecting pieces 63 mounted to two opposite ends of the same side of the supporting piece 61. Each connecting piece 63 is substantially L-shaped, and comprises an extending portion 631 extending out from the supporting piece 61 and a connecting portion 633 substantially perpendicularly extending up from a distal end of the extending portion 631. Two connecting pieces 63 of each positioning member 60 cooperatively bound a receiving slot 635 therebetween. A middle of each connecting portion 633 defines a through hole 632.

Figure 3:
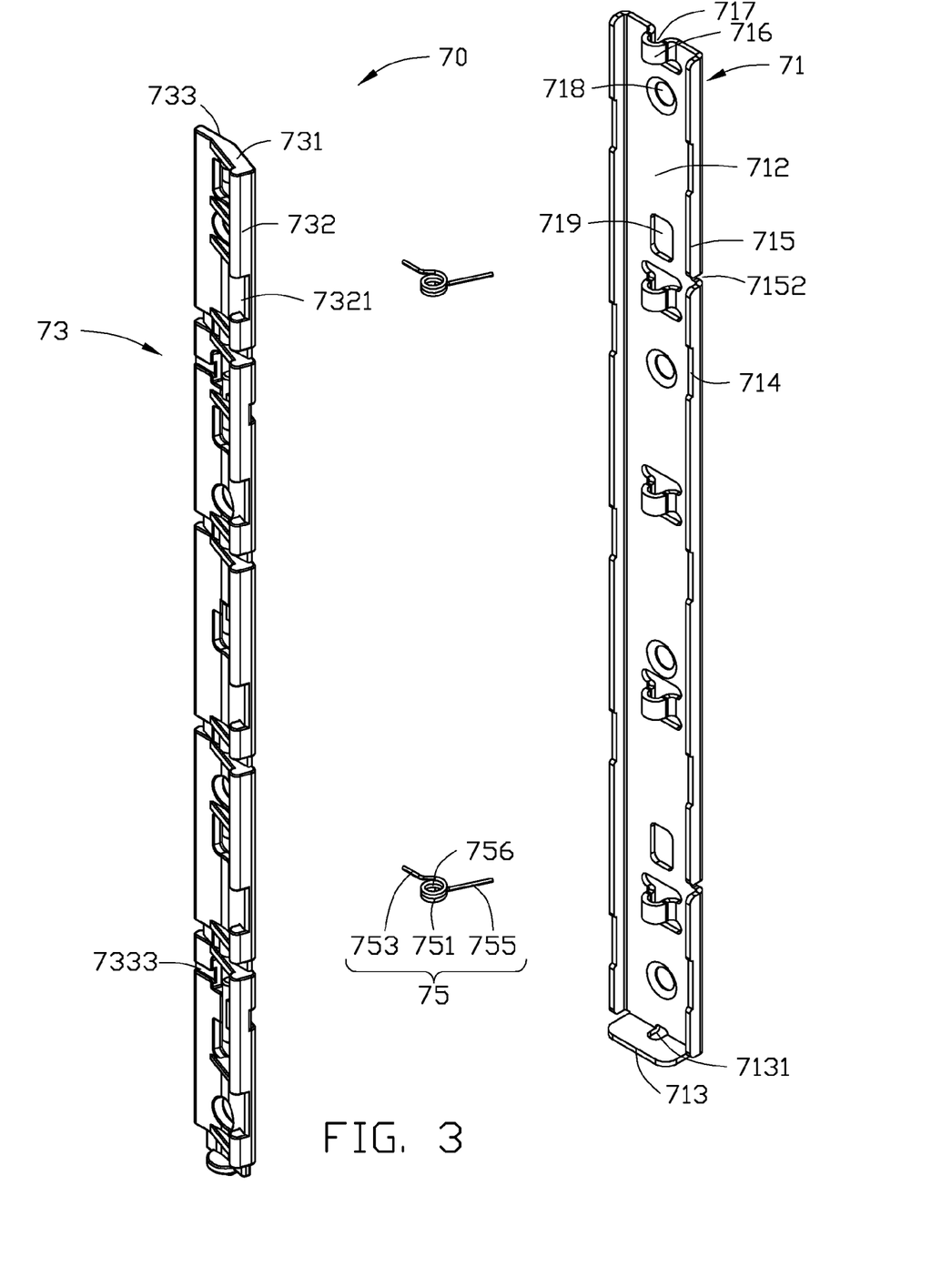
FIG. 3 is an exploded, isometric view of the slide rail interlocking apparatus of FIG. 1.
Figure 4:
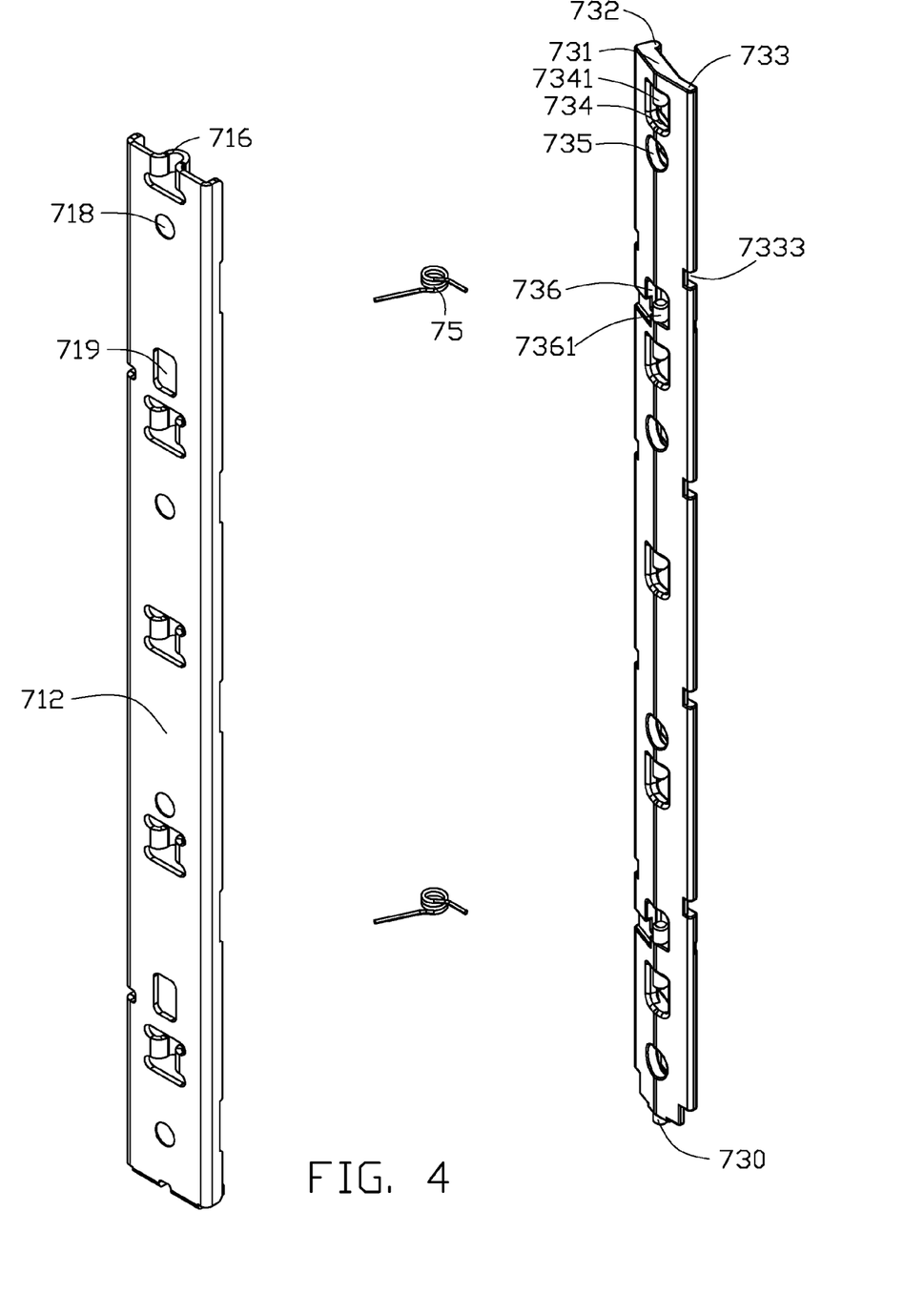
FIG. 4 is similar to FIG. 3, but viewed from another perspective.

FIGS. 3 and 4 illustrate the slide rail interlocking apparatus 70 comprising a bracket 71, a rotating member 73, and two resilient members 75.

The bracket 71 comprises a substantially rectangular mounting plate 712, a bottom plate 713 substantially perpendicularly extending out from a bottom end of the mounting plate 712, two opposite flanges 715 substantially perpendicularly protruding from front and rear sides of the mounting plate 712, and a plurality of connecting portions 716 protruding from a middle of an inner surface of the mounting plate 712. The connecting portions 716 are arrayed in a line along a lengthwise direction of the mounting plate 712. The flanges 715 are located at the same side with the bottom plate 713. Each connecting portion 716 is substantially arch shaped, and defines a rotating hole 717 along the lengthwise direction of the mounting plate 712. The rotating holes 717 are coaxial, and the axis of the rotating holes 717 is parallel to the lengthwise direction of mounting plate 712. The middle of the mounting plate 712 defines a plurality of fastening holes 718 arranged along the lengthwise direction of the mounting plate 712 and two receiving holes 719 arranged at two opposite ends of the mounting plate 712. An edge of each flange 715 away from the mounting plate 712 defines a plurality of cutouts 714. The bottom plate 713 defines a positioning hole 7131 aligning with the rotating holes 717. One of the flanges 715 located at the front side of the mounting plate 712 defines two latching slots 7152 adjacent to the receiving holes 719.

The rotating member 73 comprises a substantially rectangular rotating plate 731, an abutting bar 732 located at a front side of the rotating plate 731, and a stopper bar 733 slantingly extending out from a rear side of the rotating plate 731. The abutting bar 732 is located at the same side of the rotating plate 731 with the stopper bar 733. A junction of the rotating plate 731 and the stopper bar 733 defines a plurality of receiving slots 734, a plurality of through holes 735, and two installing slots 736. The receiving slots 734 are arranged along a lengthwise direction of the rotating plate 731, the through holes 735 are arranged along the lengthwise direction of the rotating plate 731, and the installing slots 736 are arranged at two opposite ends of the rotating member 73. A shaft 7341 substantially perpendicularly extends down from a middle of a top edge of each receiving slot 734, and a distal end of the shaft 7341 is spaced from a bottom edge of the receiving slot 734. The shafts 7341 are coaxial. A pole 7361 substantially perpendicularly extends up from a bottom edge of each installing slot 736, and a distal end of the pole 7361 is spaced from a top edge of the installing slot 736. The abutting bar 732 defines a plurality of cutouts 7321 arranged along a lengthwise direction of the abutting bar 732. A connecting shaft 730 substantially perpendicularly extends down from a bottom surface of the rotating member 73 aligning with the shafts 7341. An inner surface of the stopper bar 733 defines two latching slots 7333 adjacent to the corresponding installing slots 736.

In the embodiment, each resilient member 75 is a spring. The resilient member 75 comprises a main body 751, a first connecting portion 753 and a second connecting portion 755 extending out from two opposite ends of the main body 751. The main body 751 axially defines a positioning hole 756.

Figure 5:
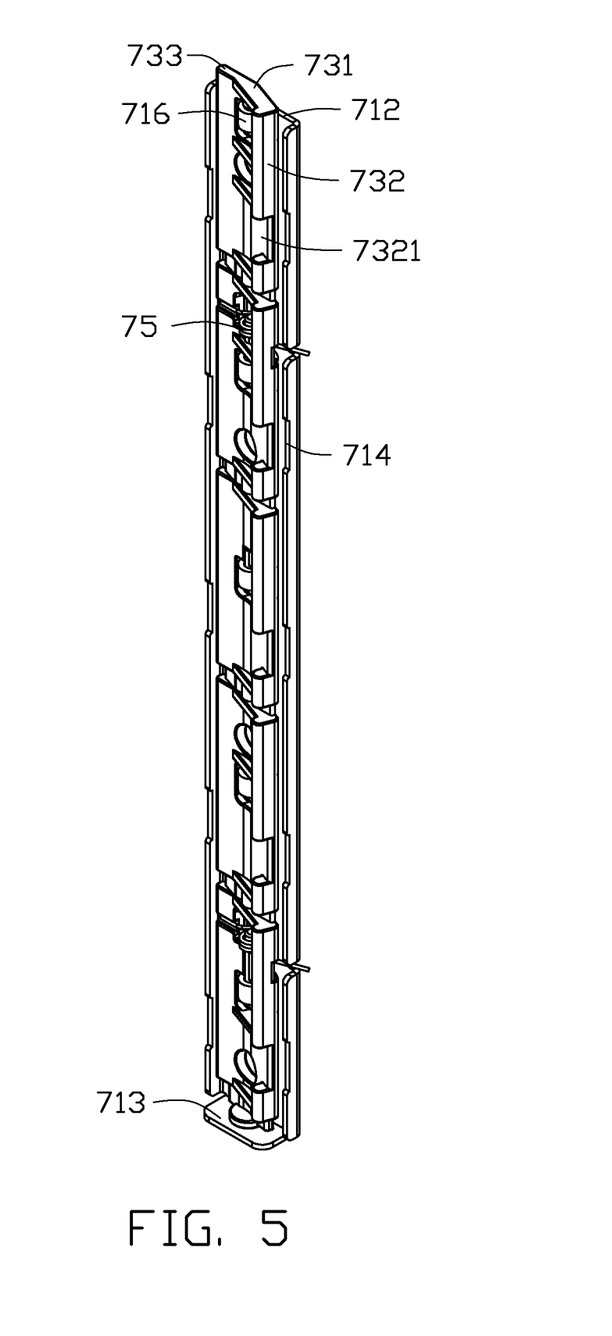
FIG. 5 is an assembled, isometric view of the slide rail interlocking apparatus of FIG. 3.
Figure 6:
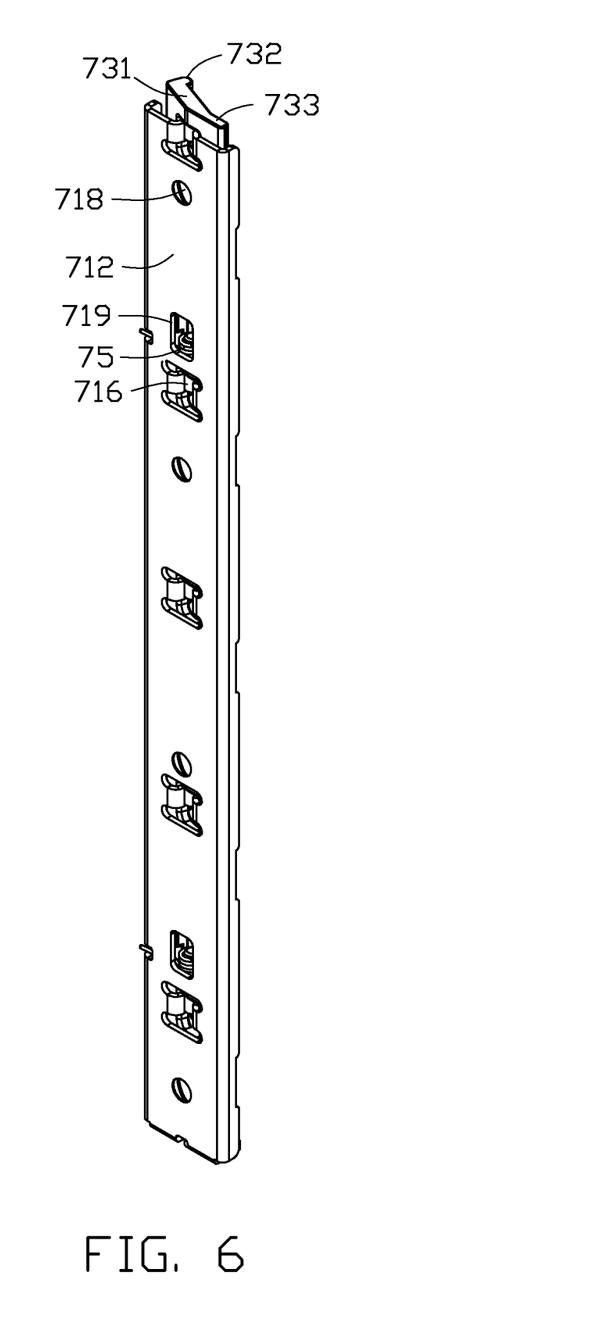
FIG. 6 is an assembled, isometric view of the slide rail interlocking apparatus of FIG. 4.

FIGS. 5 and 6 show the slide rail interlocking apparatus 70 in assembly, the resilient members 75 are received in the installing slots 736 of the rotating member 73, and each pole 7361 is inserted into the positioning hole 756 of the corresponding resilient member 75. The first connecting portion 753 of each resilient member 75 is received in the corresponding latching slot 7333 of the rotating member 73. The rotating member 73 is placed between the flanges 715 of the bracket 71, the connecting portions 716 are inserted into the corresponding receiving slots 734 of the rotating member 73, and the rotating shaft 730 of the rotating member 73 aligns with the positioning hole 7131 of the bracket 71. The shafts 7341 of the rotating member 73 align with the rotating holes 717 of the bracket 71. The rotating member 73 is moved down relative to the bracket 71, the rotating shaft 730 is rotatably inserted in the positioning hole 7131, and the shafts 7341 are rotatably inserted in the rotating holes 717 of the bracket 71. The second connecting portion 755 of each resilient member 75 is latched in the corresponding latching slot 7152. The rotating member 73 is rotatably connected with the bracket 71 about the shafts 7341 and the rotating shaft 730. The main body 751 of each resilient member 75 is received in the corresponding receiving hole 719, and the resilient member 75 is sandwiched between the rotating member 73 and the bracket 71. The resilient members 75 abut against the rotating member to rotate, and the stopper bar 733 moves toward the mounting plate 712, until the stopper bar abuts against the mounting plate 712, and the abutting bar 732 moves away from the mounting plate 712.

Figure 7:
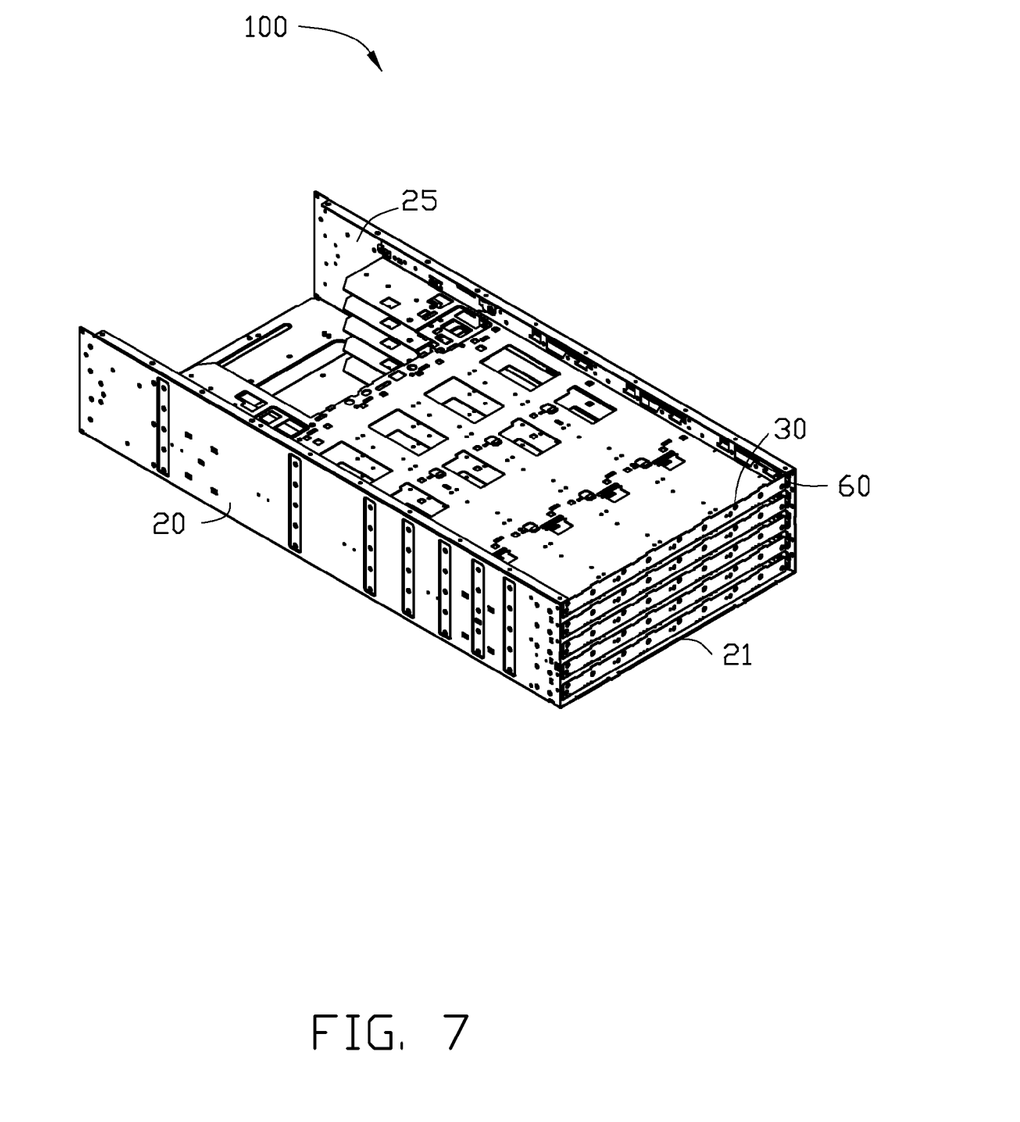
FIG. 7 is an assembled, isometric view of the electronic device of FIG. 1.
Figure 8:
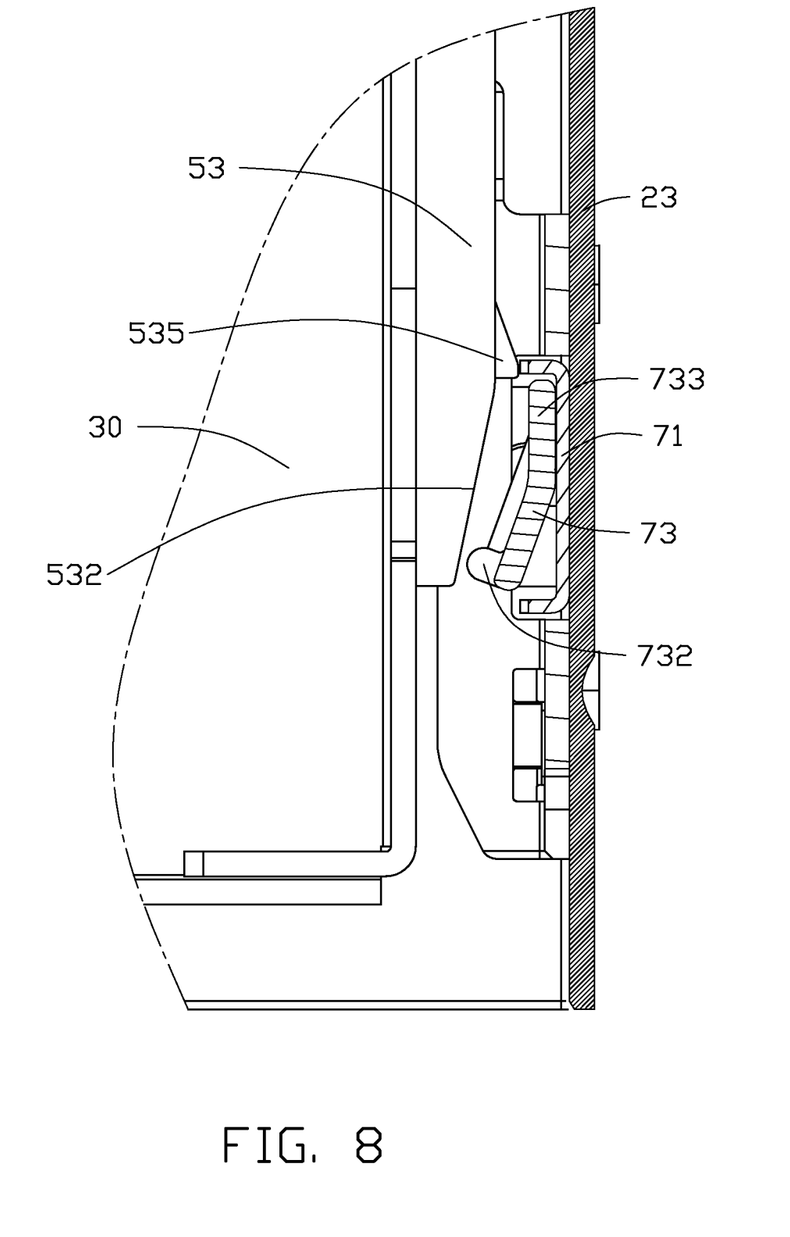
FIG. 8 is partial cross-sectional views of FIG. 7, showing a first state of use.
Figure 9:
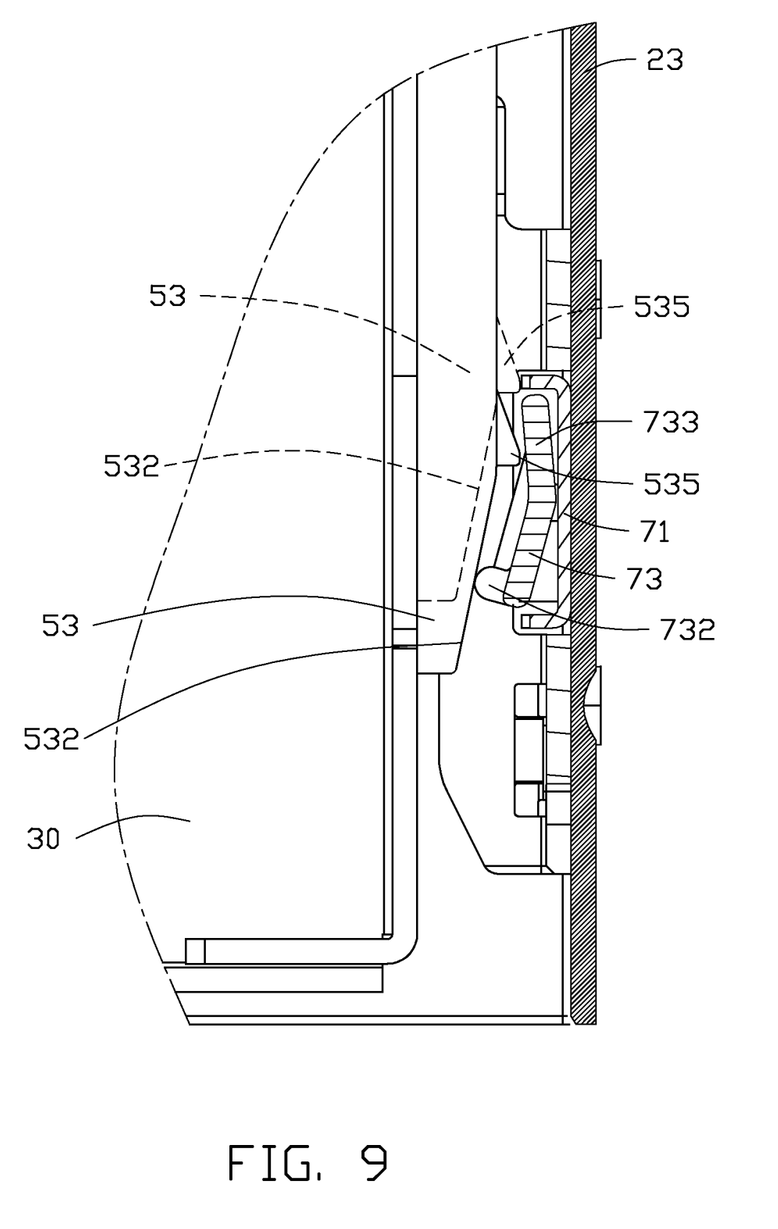
FIG. 9 is similar to FIG. 8, showing a second state of use.
Figure 10:
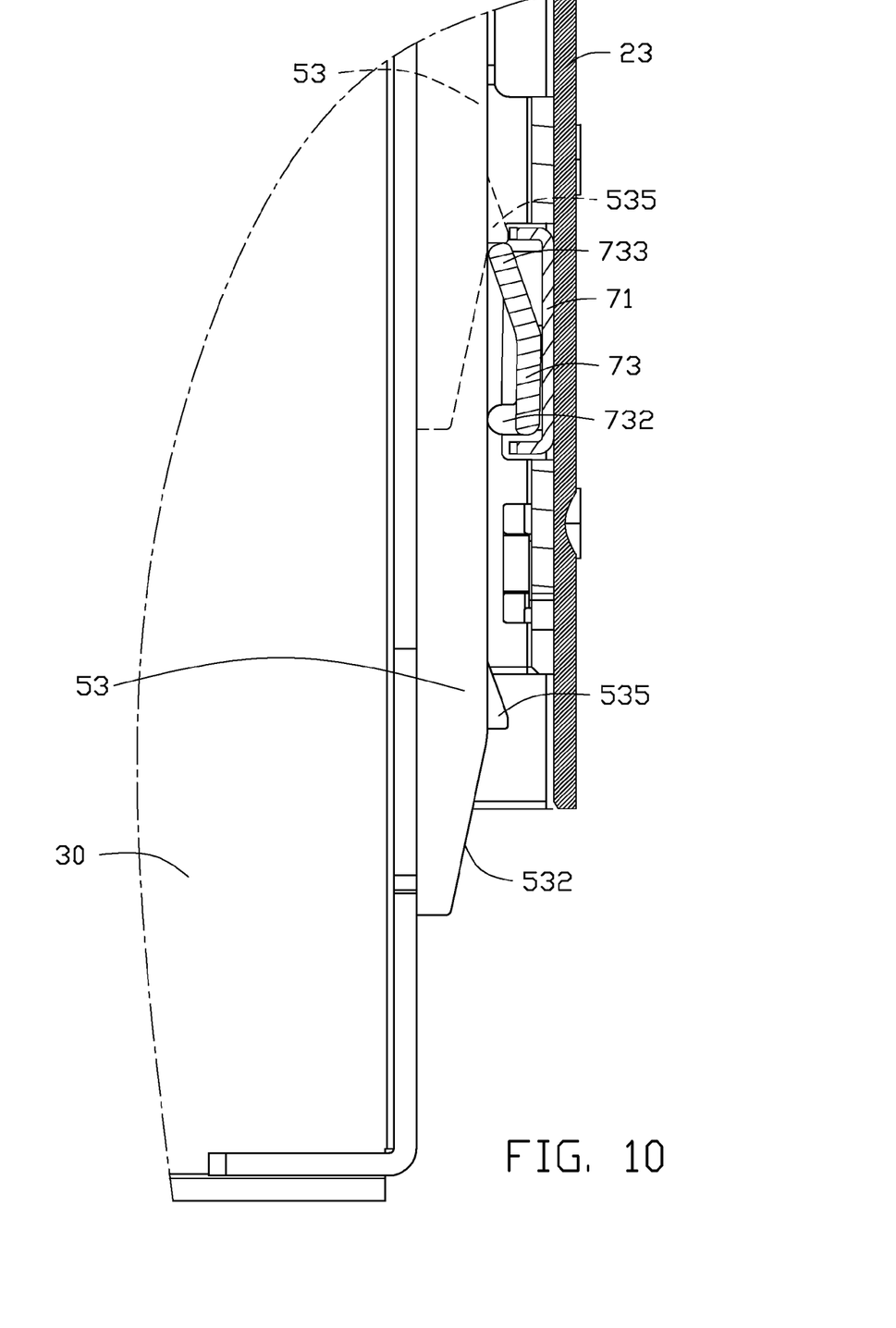
FIG. 10 is similar to FIG. 8, showing a third state of use.
Figure 11:
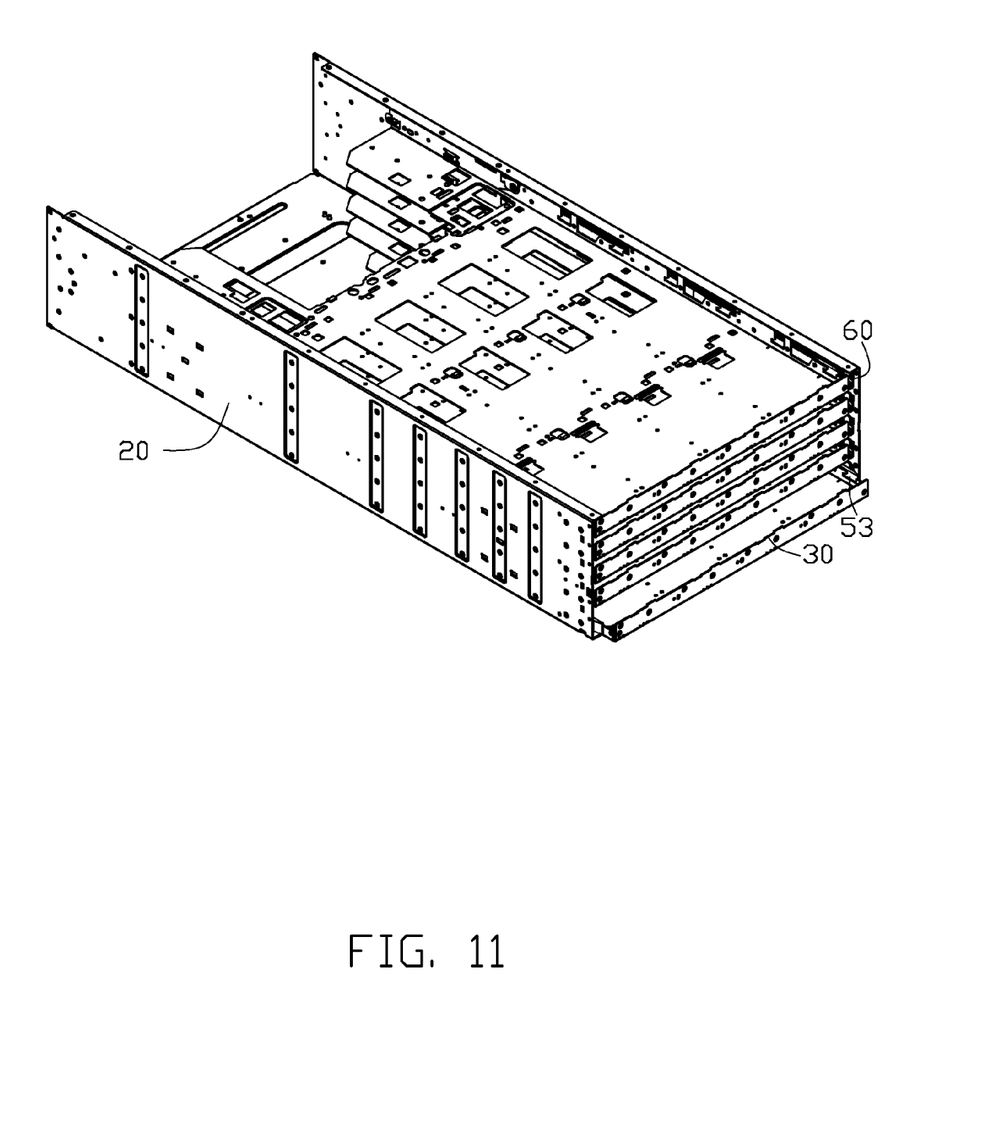
FIG. 11 is similar to FIG. 7, but showing a different state of use.

FIGS. 1 and 7 show that the slide rail interlocking apparatus 70 is installed to the cabinet 20, and the slide rail interlocking apparatus 70 is received in the receiving space 25 of the cabinet 20. An outer surface of the bracket 71 is engaged with the front portion of the inner surface of one of the side wall 23. The slide rail interlocking apparatus 70 is perpendicular to the bottom wall 21, the stopper bar 733 is located adjacent to front ends of the first slide rails 52, and the cutouts 7321 of the rotating member 73 align with the corresponding first slide rails 52. A plurality of fasteners (not shown) extend through the through holes 735 of the rotating member 73 and the corresponding fastening holes 718, to latch in the corresponding installing holes 232 of the cabinet 20. The bracket 70 is mounted to the corresponding side wall 23. One part of the positioning member 60 is received in the receiving space 25, and outer surfaces of the connecting pieces 63 of each positioning member 60 engage with the inner surface of one side wall 23 thereby mounting the slide rail interlocking apparatus 70. The slide rail interlocking apparatus 70 is received in the receiving slots 635 of the corresponding positioning members 60, and each positioning member 60 aligns with the corresponding first slide rail 52. A plurality of fasteners (not shown) extends through the through holes 632 of the positioning members 60, to engage in the corresponding installing holes 232. The other parts of the positioning members 60 are received in the receiving space 25, and outer surfaces of the connecting pieces 63 of the positioning members 60 engage with a front end of the inner surface of the other side wall 23, and each positioning member 60 aligns with the corresponding first slide rail 52. A plurality of fasteners (not shown) extends through the through holes 632 of the corresponding positioning members 60 to latch to the other side wall 23.

In assembling the chasses 30 to the cabinet 20, a rear end of each chasses 30 is inserted into the receiving space 25 from the front end of the cabinet 20, and rear ends of the second slide rails 53 extend through the corresponding positioning members 60 and slidably supported on the supporting pieces 61. The guiding surface 532 locating the rear end of the chasses 30 slidably abuts against the abutting bar 732 to rotate the rotating member 73, the stopper bar 733 moves away from the mounting plate 712, and deforming the resilient members 75. The chasses 30 is further pushed into the cabinet 20, the stopper bar 733 slidably abuts against the outer surface of the corresponding second slide rail 53, and the second slide rails 53 are inserted into the corresponding first slide rails 52. The block 535 of the second slide rail 53 extends through the corresponding cutout 7321 of the rotating member 73, until the guiding surface 532 located at the front end of the second slide rail slides over the abutting bar 732. The resilient members 75 are restored to drive the rotating member 73 to rotate, until the stopper bar 733 abuts against the mounting plate 712. The chasses 30 is installed in the cabinet 20, and the block 535 of the second slide rail 53 is located at a rear side of the stopper bar 733.

FIGS. 8-11 show that the processes of disassembling one of the chasses 30 from the cabinet 20, the chasses 30 is pulled toward the front end of the cabinet 20. The guiding surface 532 located at the front end of the second slide rail 53 slidably abuts against the abutting bar 732, to rotate the rotating member 73, and deform the resilient members 75. The block 535 of the one of the chasses 30 slides through the corresponding cutout 7321, the abutting bar 732 slidably abuts against the outer surface of the second slide rail 53, and the stopper bar 733 engages against the outer surface of the second slide rail 53. The blocks 535 of other chasses 30 are latched by the stopper bar 733 for avoiding the chasses 30 disengaging from the cabinet 20. The one of the chasses 30 is further pulled away from the cabinet 20, until the guiding surface 532 located at the rear end of the second slide rail 53 slides over the abutting bar 732, the resilient members 75 are restored to rotate the rotating member 73 until the stopper bar 733 abuts against the mounting plate 712.

In another embodiment, the bracket 71 can be omitted, the rotating member 73 can be directly connected to the inner surface of the side wall 23, and the resilient members 75 can be installed between the side wall 23 and the rotating member 73.

Even though numerous characteristics and advantages of the embodiments have been set forth in the foregoing description, together with details of the structure and function of the embodiments, the present disclosure is illustrative only, and changes may be made in details, including in the matters of shape, size, and arrangement of parts within the principles of the embodiments to the full extent indicated by the broad general meaning of the terms in which the appended claims are expressed.

What is claimed is:

1. A slide rail interlocking apparatus comprising:
   a plurality of first slide rails mounted to a cabinet;
   a plurality of chassis received in the cabinet;
   a second slide rail mounted to each of the chassis, wherein each second slide rail is fitted about the corresponding first slide rail;
   a rotating member rotatably connected to the cabinet locating at front ends of the first slide rails, wherein the rotating member comprises an abutting bar located at a front side of the rotating member and a stopper bar located at a rear side of the rotating member; and
   a resilient member installed between the rotating member and the cabinet;
   wherein, each second slide rail comprises a guiding surface formed at a front end of the second slide rail and a block protruding from the front end of each second slide rail located at a rear end of the guiding surface; and
   wherein, when one of the chassis is pulled forward, the guiding surface slidably abuts against the abutting bar to rotate the stopper bar away from the chassis, the stopper bar is rotated to be adjacent to the chassis, deforming the resilient member, and the blocks of the other chassis are latched by the stopper bar;
   and when one of the chassis is pulled to disengage from the cabinet, the abutting bar is disengaged from the corresponding second slide rail, the resilient member is restored to drive the stopper bar to rotate away from the chassis, and the blocks of the other chassis are disengaged by the stopper bar.

2. The slide rail interlocking apparatus of claim 1, further comprising a bracket mounted to the cabinet, the bracket is located at the front ends of the first slide rails, the rotating member is rotatably connected to the bracket, and the resilient member is installed between the bracket and the rotating member.

3. The slide rail interlocking apparatus of claim 2, wherein the bracket comprises a mounting plate mounted to the cabinet and a plurality of connecting portions located at the mounting plate, the rotating member is rotatably connected with the bracket by the connecting portions.

4. The slide rail interlocking apparatus of claim 3, wherein the rotating member further comprises a rotating plate rotatably connected to the connecting portions of the bracket, the abutting bar is located at a front side of the rotating plate, the stopper bar is located at a rear side of the rotating plate, and the abutting bar is located at the same side with the stopper bar.

5. The slide rail interlocking apparatus of claim 3, wherein the rotating plate defines a plurality of receiving slots, the connecting portions of the bracket are rotatably received in the receiving slots of the rotating plate.

6. The slide rail interlocking apparatus of claim 5, wherein rotating plate comprises a plurality of shafts extending from the rotating plate toward the corresponding receiving slots, axial leads of the shafts are arranged at the same line, each connecting portion defines a rotating hole, axial leads of the rotating holes of the bracket are arranged at the same line perpendicular to the glide direction of the chassis, each shaft is rotatably received in the corresponding rotating hole.

7. The slide rail interlocking apparatus of claim 6, wherein each shaft extends down from a top surface of the corresponding receiving slot, a distal end of the shaft is spaced from a bottom surface of the corresponding receiving slot.

8. The slide rail interlocking apparatus of claim 3, wherein the bracket further comprises a bottom plate extending out from a bottom end of the mounting plate, the bottom plate defines a positioning hole, the rotating member further comprises a rotating shaft extending down from a bottom of the rotating member, the rotating shaft is rotatably received in the positioning hole of the bracket.

9. The slide rail interlocking apparatus of claim 1, wherein the abutting bar defines a plurality of cutouts opposite to the blocks of the second slide rails, one of the chassis is pulled forward, and the block of the one of the chassis extends through the corresponding cutouts.

10. An electronic device comprising:
    a cabinet comprising a bottom wall and a side wall extending up from a side of the bottom wall;
    a plurality of chassis received in the cabinet;
    a plurality of first slide rails mounted to the side wall each extending along a lengthwise direction of the side wall;
    a plurality of second slide rails mounted to the chassis, wherein each second slide rail is fitted about the corresponding first slide rail;
    a rotating member rotatably connected to a front portion of the side wall, wherein the rotating member is located at front ends of the first slide rails, the rotating member comprises an abutting bar located away from the first slide rails and a stopper bar located adjacent to the first slide rails; and
    a resilient member installed between the rotating member and the side wall;
    wherein, each second slide rail comprises a first guiding surface formed at a front end of the second slide rail and a block protruding from the front end of each second slide rail located at a rear end of the first guiding surface; and wherein, when one of the chassis is pulled forward, the first guiding surface slidably abuts against the abutting bar to rotate the stopper bar away from the chassis, the stopper bar is rotated to be adjacent to the chassis, to deform the resilient member, and the blocks of the other chassis are latched by the stopper bar;

each second slide rail further comprises a second guiding surface formed at the second slide rail, and when one of the chassis is pulled to disengage from the cabinet, the second guiding surface across over the abutting bar, the resilient member is restored to drive the stopper bar to rotate away from the chassis, and the blocks of the other chassis are disengaged by the stopper bar.

11. The electronic device of claim 10, further comprising a bracket mounted to the front portion of the side wall, the bracket is located at the front ends of the first slide rails, the rotating member is rotatably connected to the bracket, and the resilient member is installed between the bracket and the rotating member.

12. The electronic device of claim 11, wherein the bracket comprises a mounting plate mounted to the side wall and a plurality of connecting portions located at the mounting plate, and the rotating member is connected with the bracket by the connecting portions.

13. The electronic device of claim 12, wherein the rotating member further comprises a rotating plate rotatably connected to the connecting portions of the bracket, the abutting bar is located at a front side of the rotating plate, the stopper bar is located at a rear side of the rotating plate, and the abutting bar is located at the same side with the stopper bar.

14. The electronic device of claim 12, wherein the rotating plate defines a plurality of receiving slots, and the connecting portions of the bracket are rotatably received in the receiving slots of the rotating plate.

15. The electronic device of claim 14, wherein rotating plate comprises a plurality of shafts extending from the rotating plate toward the corresponding receiving slots, axial leads of the shafts are arranged at the same line, each connecting portion defines a rotating hole, axial leads of the rotating holes of the bracket are arranged at the same line perpendicular to the glide direction of the chassis, and each shaft is rotatably received in the corresponding rotating hole.

16. The electronic device of claim 15, wherein each shaft extends down from a top surface of the corresponding receiving slot, and a distal end of the shaft is spaced from a bottom surface of the corresponding receiving slot.

17. The electronic device of claim 12, wherein the bracket further comprises a bottom plate extending out from a bottom end of the mounting plate, the bottom plate defines a positioning hole, the rotating member further comprises a rotating shaft extending down from a bottom of the rotating member, and the rotating shaft is rotatably received in the positioning hole of the bracket.

18. The electronic device of claim 10, wherein the abutting bar defines a plurality of cutouts opposite to the blocks of the second slide rails, one of the chassis is pulled forward, and the block of the one of the chassis extends through the corresponding cutouts.

19. A slide rail interlocking apparatus comprising:
a plurality of first slide rails mounted to a cabinet;
a plurality of chassis received in the cabinet;
a second slide rail mounted to each of the chassis, wherein each second slide rail is fitted about the corresponding first slide rail;
a rotating member rotatably connected to the cabinet locating at front ends of the first slide rails, wherein the rotating member comprises an abutting bar located at a front side of the rotating member and a stopper bar located at a rear side of the rotating member; and
a resilient member installed between the rotating member and the cabinet;
wherein, each second slide rail comprises a guiding surface formed at a front end of the second slide rail and a block protruding from the front end of each second slide rail located at a rear end of the guiding surface;
wherein, when one of the chassis is pulled forward, the guiding surface slidably abuts against the abutting bar to rotate the stopper bar away from the chassis, the stopper bar is rotated to be adjacent to the chassis, deforming the resilient member, and the blocks of the other chassis are latched by the stopper bar; and
wherein the abutting bar defines a plurality of cutouts opposite to the blocks of the second slide rails, whereby when one of the chassis is pulled forward the block of the pulled chassis extends through the corresponding cutout.

* * * * *